TEMPERATURE COMPENSATED TRANSISTOR BLOCKING OSCILLATOR

Filed May 14, 1965

INVENTORS
CHI-SHENG LIU &
JOSEPH H. NEVIN
BY Eugene M. Whitacre
Attorney 3,360,742
TEMPERATURE COMPENSATED TRANSISTOR BLOCKING OSCILLATOR Chi-Sheng Liu, Indianapolis, Ind., and Joseph H. Nevin, Cincinnati, Ohio, assignors to Radio Corporation of America, a corporation of Delaware Filed May 14, 1965, Ser. No. 455,707
6 Claims. (Cl. 331—66)

ABSTRACT OF THE DISCLOSURE

In a transistor blocking oscillator, a temperature dependent voltage source is coupled to the blocking oscillator charging capacitor. A voltage divider including a fixed value resistor and a negative temperature coefficient thermistor is coupled via a hold control variable resistor to the capacitor. Temperature variations which tend to vary the base emitter conduction threshold of the blocking oscillator transistor also cause the thermistor and therefore the charging supply voltage to vary in a compensating manner. Oscillator frequency is maintained constant as temperature changes.

Figures 1, 2:
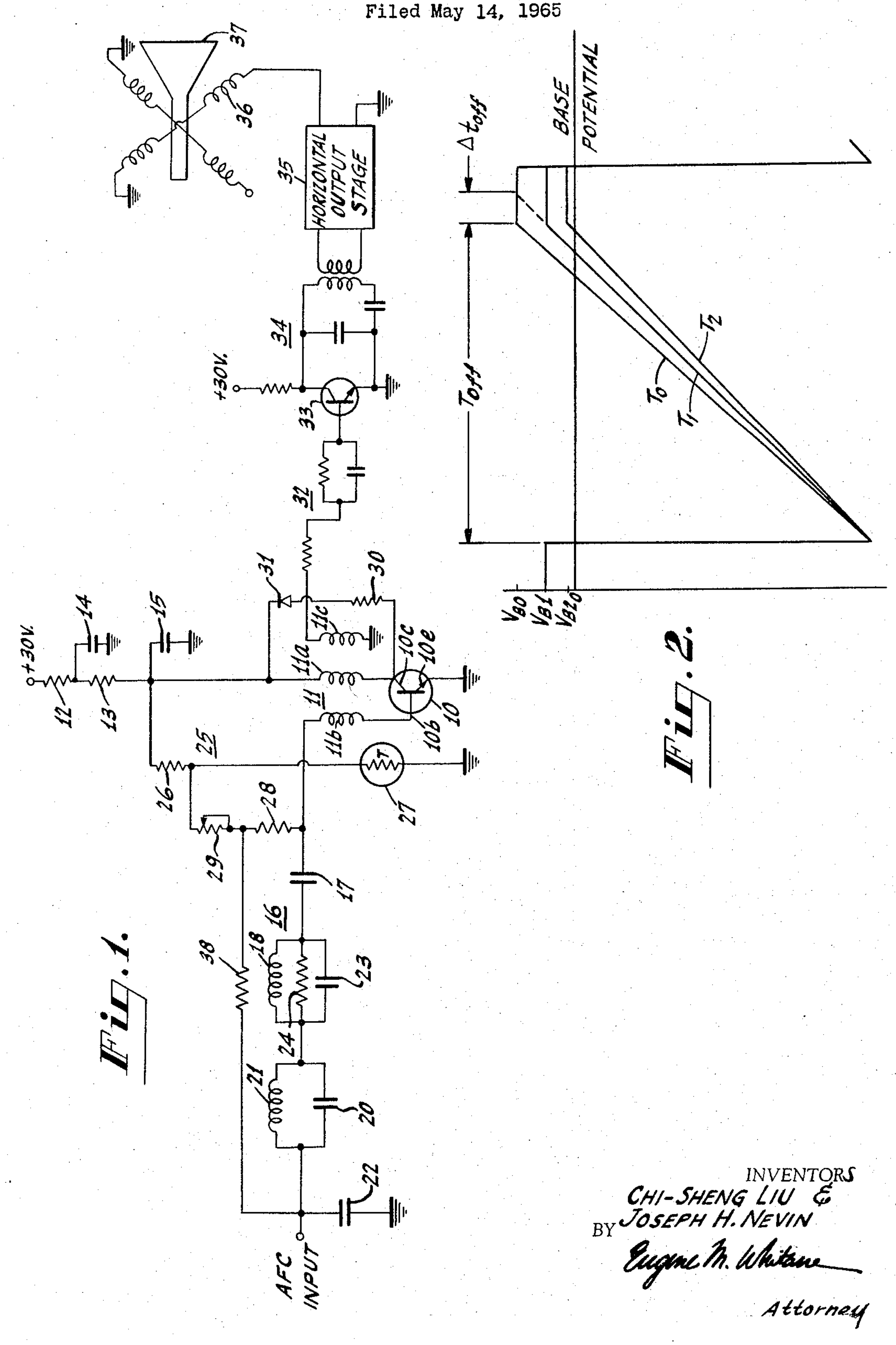

This invention relates to a transistor blocking oscillator and, in particular, to a blocking oscillator wherein means are provided for decreasing substantially the variations of oscillator frequency which normally accompany variations in ambient temperature.

In a typical transistor blocking oscillator, a transistor is switched successively between conductive and non-conductive states, the duration of the non-conductive state being controlled principally as a function of the time constant of a resistance-capacitance circuit. Typically, the capacitance is coupled between the input (e.g. base and emitter) terminals of the transistor while the resistance is returned to a suitable voltage source. The transistor is switched on which the voltage across the capacitance (i.e., base to emitter voltage) reaches the base-emitter diode conduction voltage for the particular transistor. This conduction voltage varies inversely with temperature, a lesser voltage being required to switch the transistor to an "on" or forwardly conductive state as ambient temperature increases. Consequently, the transistor "off" time and cycle duration decrease as temperature increases. The frequency of operation of the blocking oscillator therefore tends to vary directly with temperature.

While the present invention is useful in a variety of applications, it is particularly suitable for use in connection with the horizontal deflection circuit of a transistor television receiver, an application wheren the frequency of oscillation of the blocking oscillator should be maintained relatively constant. The invention may be used, for instance, in connection with the circuit described in the copending application for patent of Thomas W. Burrus entitled "Transistor Blocking Oscillator," Ser. No. 439,606, now Patent No. 3,290,612, filed Mar. 15, 1965 and assigned to the same assignee as the present invention.

An object of the present invention is to provide a transistor blocking oscillator wherein means are provided for decreasing substantially the effects of ambient temperature variations upon the oscillation frequency.

It is another object of the present invention to provide a transistor blocking oscillator wherein means are provided for decreasing substantially the effect upon the oscillator frequency of variations in transistor turn-on voltage caused by variations in ambient temperature.

In accordance with the present invention, a transistor blocking oscillator comprises a resistance-capacitance circuit for controlling the duration of the "off" or non-conductive portion of each oscillation cycle. A voltage source is coupled in series relation with the resistance-capacitance circuit, the capacitance being coupled to the input terminals of the transistor blocking oscillator. The voltage source includes means responsive to variations in ambient temperature for varying the voltage applied to the resistance-capacitance circuit in an inverse manner with respect to temperature variations. The variation in applied voltage preferably is arranged with respect to a temperature dependent variation in transistor turn-on voltage such that the non-conduction time interval of the blocking oscillator is maintained substantially constant throughout the expected range of operational ambient temperatures.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing in which:

FIGURE 1 is a schematic circuit diagram, partially in block diagram form, of a horizontal deflection waveform generating portion of a television receiver including a transistor blocking oscillator constructed in accordance with the present invention; and FIGURE 2 is a simplified waveform diagram, not drawn to scale, illustrating the effect, in accordance with the present invention, of varying the voltage supplied to the blocking oscillator discharge circuit to compensate for variations in ambient temperature.

Referring to FIGURE 1, a blocking oscillator constructed in accordance with the present invention comprises a transistor 10 having a base electrode **10*b*, a collector electrode 10*c* and an emitter electrode 10*e*. Emitter electrode 10*e* is grounded while collector electrode 10*c* is coupled to a suitable positive voltage supply (e.g. +30 v.) by means of the series combination of a primary winding 11*a* of a three winding transformer 11 and dropping resistors 12 and 13. Capacitors 14 and 15 bypass resistors 12 and 13, respectively, to ground. The emitter-collector circuit of transistor 10 is regeneratively coupled to the base-emitter circuit thereof by means of feed-back winding 11*b* inductively associated with primary winding 11*a* and having one end coupled to base electrode 10*b*. As described in the above-mentioned copending Burrus application Ser. No. 439,606, now Patent No. 3,290,612, the other end of feedback winding 11*b* is coupled to the series combination of: (1) a series resonant circuit 16 essentially comprising a capacitor 17 and an inductor 18; and (2) a parallel resonant circuit 19 comprising a capacitor 20 and an inductor 21. The parallel resonant circuit 19 is returned to ground by means of a capacitor 22, the junction of resonant circuit 19 and capacitor 22 being coupled to a source of automatic frequency control (AFC) voltage (not shown). An AFC voltage developed across capacitor 22 is direct coupled by means of a resistor 38, resistor 28 and winding 11*b* to base electrode 10*b* of transistor 10. A switching capacitor 23 and a damping resistor 24 each are coupled in parallel with inductor 18**.

A temperature responsive voltage divider circuit 25 comprising the series combination of a resistor 26 and a temperature dependent resistor or thermistor 27 having a negative temperature coefficient of resistance is coupled from the junction of resistor 13 and primary winding **11*a*** to ground.

Capacitor 17 is coupled by means of the series combination of a resistor 28 and a frequency controlling variable potentiometer or "hold" control 29 to a variable positive potential developed at the junction of resistor 26 and thermistor 27.

A damping circuit comprising the series combination of a resistor 30 and a diode 31 is coupled across primary winding 11*a*.

The output signal produced across primary winding 11*a* is coupled by means of a third winding 11*c* of transformer 11 and a resistance-capacitance coupling circuit 32 to a transistor amplifier 33. The coupling circuit 32 and the transistor amplifier 33 comprise a portion of a horizontal driver circuit 34. An amplified output produced by driver circuit 34 is coupled to a horizontal output stage 35, the output stage 35 being coupled in turn to a horizontal deflection winding 36 associated with an image-reproducing kinescope 37.

In the operation of the horizontal deflection waveform generating system shown in FIGURE 1, the blocking oscillator transistor 10 periodically is rendered highly conductive and substantially non-conductive according to predetermined variations in the energy stored in the components comprising series resonant circuit 16 and parallel resonant circuit 19. While the operation of those resonant circuits in connection with the blocking oscillator transistor 10 is described in detail in the Burrus application Ser. No. 439,606, now Patent No. 3,290,612, a simplified description will be given here to facilitate an understanding of the present invention.

Operation of the blocking oscillator commences when a positive voltage exceeding the base-emitter conduction or turn-on voltage of transistor 10 is applied to base electrode 10*b*. The positive voltage may be developed, for example, as a result of the charging of the capacitors 17, 20 and 22 from the voltage supply (+30 v.). The positive base-emitter voltage so developed and applied to transistor 10, in conjunction with the positive voltage applied to collector 10*c* by means of the voltage supply (+30 v.), initiates conduction in both the base-emitter (input) and collector-emitter (output) circuits of transistor 10. The base-emitter current increases rapidly, causing the collector-emitter current to increase in a similar manner. The increasing collector-emitter current causes the collector voltage to drop rapidly, the change in collector voltage being inverted and regeneratively coupled via windings 11*a* and 11*b* of transformer 11 to base electrode 10*b* such that transistor 10 is driven rapidly into a saturation conduction state. After the initial surge of base current drives transistor 10 into saturation, the base current varies in a substantially half-sinusoidal manner, the frequency of the current variation being determined principally by the resonant frequency of series resonant circuit 16. When the base current decreasing sufficiently after having passed through aproximately one-half cycle of oscillation, transistor 10 is driven out of saturation, causing the collector current to decrease and the collector voltage to increase. The change in collector voltage is coupled regeneratively to base electrode 10*b* via transformer 11, rapidly cutting off conduction in transistor 10. A voltage pulse having a duration determined substantially by the oscillation frequency of series resonant circuit 16 has therefore been produced at collector electrode 10*c*. The voltage at collector electrode 10*c* then remains substantially constant at a positive level slightly less than the voltage supply (+30 v.) throughout the non-conductive or "off" portion of the blocking oscillator cycle.

During the "off" portion of the cycle, the voltage at base electrode 10*b*, which was driven sharply negative as the collector voltage increased, increases from the attained negative level in a substantially exponential manner, the exponential voltage being modified by a sinusoidal voltage variation appearing across parallel resonant circuit 19. The exponential voltage variation is produced by the discharge of capacitor 17 through the series combination of resistor 28 and hold control 29 towards the positive potential existing at the junction of resistor 26 and thermistor 27.

Transistor 10 is switched "on" or returned to a conductive state to start a new oscillation cycle when the voltage at base 10*b* (supplied by capacitor 17) passes through the base-emitter diode conduction or turn-on voltage required for transistor 10. The sinusoidal voltage component attributable to parallel resonant circuit 19 serves to cause the voltage at base electrode 10*b* to rise sharply through the turn-on voltage for transistor 10. The cycle described above is repeated at an appropriate rate (e.g. 15,750 cycles per second) to provide voltage pulses at the television horizontal scanning frequency.

The output pulse waveform produced at collector electrode 10*c* is applied via winding 11*c* and coupling circuit 32 to transistor amplifier 33. An amplified pulse output produced by amplifier 33 is coupled to a horizontal output stage 35. Output stage 35, in response to the applied pulse waveform, supplies to horizontal deflection winding 36 a substantially sawtooth current waveform to deflect an electron beam across the face or screen of kinescope 37 in a recurring pattern.

A direct voltage supplied by an AFC circuit (not shown) is developed across capacitor 22 and coupled via resistors 38 and 28 to base electrode 10*b* to maintain the operation of the blocking oscillator substantially in synchronism with the synchronizing signal component of the composite television signal being processed by the remainder (not shown) of the television receiver.

While the waveform contribution of the parallel tuned circuit 19 substantially decreases the effect upon the blocking oscillator operating frequency of variations in component parameters and supply voltage, variations in ambient temperature produce additional uncompensated variations in the blocking oscillator frequency.

Specifically, as noted above, the base-emitter turn-on voltage of transistor 10 varies inversely with temperature. Referring to FIGURE 2, the effect of ambient temperature variations upon the transistor turn-on voltage and upon oscillator frequency may be illustrated in the following manner. Since the present invention may be applied equally to the embodiment illustrated in FIGURE 1 as well as to blocking oscillators which do not include the parallel resonant circuit 19, the description which follows and the waveforms shown in FIGURE 2 will not include any reference to the effect of resonant circuit 19 described above.

In FIGURE 2, the waveform labelled $T_1$ illustrates the exponential base-emitter voltage (approximating a linear waveform) applied to transistor 10 at a given ambient temperature $T_1$. The base-emitter turn-on voltage for transistor 10 at the ambient temperature $T_1$ is indicated by the voltage $V_{B1}$. The corresponding non-conductive portion (the interpulse period) of the blocking oscillator cycle is indicated by the designation $T_{off}$. A decrease in ambient temperature produces an increase in the turn-on voltage for transistor 10, for example, to the voltage $V_{BO}$. In the absence of the temperature-responsive voltage divider circuit 25, the non-conductive portion of the blocking oscillator cycle then would increase by an amount $+\Delta t_{off}$, as shown. Consequently, the oscillation frequency would decrease. Similarly, an increase in ambient temperature would produce a decrease in transistor turn-on voltage, a decrease in blocking oscillator "off" time and an increase in oscillator frequency.

In accordance with the present invention, compensating means are provided for maintaining the oscillator frequency substantially constant despite changes in ambient temperature and consequent changes in transistor turn-on voltage.

Specifically, hold control potentiometer 29 is coupled to temperature-responsive voltage divider circuit 25 such that the voltage towards which capacitor 17 discharges varies with temperature in the same sense or direction as the base-emitter turn-on voltage for transistor 10 varies.

Thermistor 27 exhibits a negative temperature coefficient of resistance. That is, as the ambient temperature increases (e.g. from $T_1$ to $T_2$), the resistance of thermistor 27 decreases, producing a decrease in the positive voltage appearing at the junction of fixed resistor 26 and thermistor 27. As is shown in FIGURE 2, the slope of the base-emitter waveform applied to transistor 10 (i.e. the discharge waveform of capacitor 17) then decreases such that the transistor turn-on voltage $V_{B2}$ required at an ambient temperature $T_2$ is reached in the time interval $T_{off}$.

Similarly, as the ambient temperature decreases (from $T_1$ to $T_0$), the resistance of thermistor 27 increases, producing an increase in the positive voltage towards which capacitor 17 discharges. The turn-on voltage $V_{BO}$ is therefore reached in the same time interval $T_{off}$.

The thermistor 27 and fixed resistor 26 are selected and proportioned such that the effect of the change in transistor turn-on voltage is substantially nullified by the change in the voltage across thermistor 27. Furthermore, resistor 26 is selected to have a substantially lower resistance value than thermistor 27 so that, as temperature changes, substantially no change takes place in the effective discharging resistance in series with capacitor 17. The time constant associated with the discharge of capacitor 17 therefore remains substantially constant.

An embodiment of the present invention applicable to television receivers includes the following components:

| | | |
|---|---|---|
| Transistor **10** | | RCA Type 2N3568 |
| Resistor **12** | ohms | 3,900 |
| Resistor **13** | do | 220 |
| Capacitor **14** | microfarads | 100 |
| Capacitor **15** | do | 250 |
| Capacitor **17** | do | .0068 |
| Inductor **18** | millihenries | [1] 1–3 |
| Capacitor **20** | microfarads | .047 |
| Inductor **21** | millihenries | [1] 1–3 |
| Capacitor **22** | microfarads | .022 |
| Capacitor **23** | picofarads | 820 |
| Resistor **24** | ohms | 1,800 |
| Resistor **26** | do | 820 |
| Thermistor **27** | do | [2] 50,000 |
| Resistor **28** | do | 3,900 |
| Potentiometer **29** | do | [1] 12,000 |
| Resistor **30** | do | 560 |
| Diode **31** | | Type 1N60 |
| Resistor **38** | ohms | 10,000 |

[1] Adjustable. [2] At 25° C.

What is claimed is:

1. A transistor blocking oscillator for producing regularly recurring output pulses comprising a transistor having an input circuit and an output circuit, feedback means for regeneratively coupling said output circuit to said input circuit, said input circuit comprising means including capacitive means for supplying to said transistor an exponentially varying voltage substantially determinative of the interpulse period of said output pulses, discharge circuit means coupled in series combination with said capacitive means, and temperature responsive voltage supply means coupled across said series combination, said voltage supply means providing to said series combination a voltage which varies inversely with respect to variations in ambient temperature whereby the interpulse period of said output pulse is maintained substantially constant throughout the expected range of operation ambient temperatures.

2. A transistor blocking oscillator for producing regularly recurring output pulses comprising a transistor having an input circuit and an output circuit, feedback means for regeneratively coupling said output circuit to said input circuit, said input circuit comprising means including capacitive means for supplying to said transistor an exponentially varying voltage substantially determinative of the interpulse period of said output pulses, discharge circuit means including at least one resistor coupled in series combination with said capacitive means, and temperature responsive voltage supply means coupled across said series combination, said voltage supply means comprising in series relation a substantially fixed value resistor and a temperature dependent resistor, said supply means providing to said series combination at the junction of said fixed and temperature dependent resistors a voltage which varies inversely with respect to variations in ambient temperature whereby the interpulse period of said output pulse is maintained substantially constant throughout the expected range of operational ambient temperatures.

3. A transistor blocking oscillator for producing regularly recurring output pulses comprising a transistor having an input circuit and an output circuit, feedback means for regeneratively coupling said output circuit to said input circuit, said input circuit comprising means including at least one capacitor for supplying to said transistor an exponentially varying voltage substantially determinative of the interpulse period of said output pulses, discharge circuit means including at least one resistor coupled in series combination with said capacitor, and temperature responsive voltage supply means coupled across said series combination, said voltage supply means comprising in series relation a substantially fixed value resistor and a temperature dependent resistor, said supply means providing to said series combination at the junction of said fixed and temperature dependent resistors a voltage which varies inversely with respect to variations in ambient temperature whereby the interpulse period of said output pulses is maintained substantially constant throughout the expected range of operational ambient temperatures.

4. A transistor blocking oscillator for producing regularly recurring output pulses comprising a transistor having an input circuit and an output circuit, the voltage required at said input circuit to initiate conduction in said transistor being subject to variation in an inverse manner with respect to variations in ambient temperature, feedback means for regeneratively coupling said output circuit to said input circuit, said input circuit comprising means including at least one capacitor for supplying to said transistor an exponentially varying voltage substantially determinative of the interpulse period of said output pulses, discharge circuit means including a frequency control potentiometer coupled in series combination with said capacitor, and temperature responsive voltage supply means coupled across said series combination, said voltage supply means comprising a substantially constant direct voltage supply coupled to a series related fixed value resistor and a temperature dependent resistor having a negative temperature coefficient, said supply means providing to said series combination at the junction of said fixed and temperature dependent resistors a voltage which varies inversely with respect to variation in ambient temperature whereby the interpulse period of said output pulses is maintained substantially constant throughout the expected range of operational ambient temperatures.

5. A transistor blocking oscillator for producing regularly recurring output pulses comprising a transistor having base, emitter and collector electrodes, feedback means for regeneratively coupling said collector electrode to said base electrode, means including at least one capacitor for supplying to said base electrode of said transistor an exponentially varying voltage substantially determinative of the interpulse period of said output pulses, discharge circuit means including a frequency control potentiometer coupled in series combination with said capacitor, and temperature responsive voltage supply means coupled across said series combination, said voltage supply means providing to said series combination a voltage which varies inversely with respect to variations in ambient temperature whereby the interpulse period of said output pulses is maintained substantially constant throughout the expected range of operational ambient temperatures.

6. A transistor blocking oscillator for producing regularly recurring output pulses comprising a transistor having base, emitter and collector electrodes, the voltage required between said base and emitter electrodes to initiate forward conduction in said transistor being subject to variation in an inverse manner with respect to variations in ambient temperature, feedback means for regeneratively coupling said collector electrode to said base electrode, means including at least one capacitor for supplying to said base electrode of said transistor an exponentially varying voltage substantially determinative of the interpulse period of said output pulses, discharge circuit means including a frequency control potentiometer coupled in series combination with said capacitor, and temperature responsive voltage supply means coupled across said series combination, said voltage supply means including a substantially fixed value resistor, a temperature dependent resistor having a negative temperature coefficient and a substantially constant voltage supply coupled across the series circuit including said fixed and temperature dependent resistors, said supply means providing to said series combination at the junction of said fixed and temperature dependent resistors a voltage which varies inversely with respect to variations in ambient temperature whereby the interpulse period of said output pulses is maintained substantially constant throughout the expected range of operational ambient temperatures.

References Cited

UNITED STATES PATENTS 3,181,084 4/1965 Attwood ------------ 331—109

FOREIGN PATENTS 921,221 3/1963 Great Britain.

ROY LAKE, *Primary Examiner.*

J. B. MULLINS, *Assistant Examiner.*

UNITED STATES PATENT OFFICE

CERTIFICATE OF CORRECTION

Patent No. 3,360,742 December 26, 1967

Chi-Sheng Liu et al.

It is hereby certified that error appears in the above numbered patent requiring correction and that the said Letters Patent should read as corrected below.

Column 6, line 35, before ", said supply" insert -- having a negative temperature coefficient --.

Signed and sealed this 18th day of March 1969.

(SEAL)
Attest:

Edward M. Fletcher, Jr.
Attesting Officer

EDWARD J. BRENNER
Commissioner of Patents